United States Patent [19]
Ueno

[11] Patent Number: 5,963,807
[45] Date of Patent: Oct. 5, 1999

[54] SILICON CARBIDE FIELD EFFECT TRANSISTOR WITH INCREASED AVALANCHE WITHSTAND CAPABILITY

[75] Inventor: Katsunori Ueno, Nagano, Japan

[73] Assignee: Fuji Electric Co., Ltd., Japan

[21] Appl. No.: 09/057,653

[22] Filed: Apr. 9, 1998

Related U.S. Application Data

[62] Division of application No. 08/681,101, Jul. 22, 1996, abandoned.

[30] Foreign Application Priority Data

Jul. 20, 1995 [JP] Japan .................................. 7-183721

[51] Int. Cl.[6] ...................... H01L 21/336; H01L 21/3205
[52] U.S. Cl. .......................... 438/268; 438/273; 438/285; 438/589
[58] Field of Search ................................... 438/268, 273, 438/285, 520, 586, 589, 931

[56] References Cited

U.S. PATENT DOCUMENTS

| | | | |
|---|---|---|---|
| 5,155,052 | 10/1992 | Davies | 437/40 |
| 5,322,802 | 6/1994 | Baliga et al. | 437/22 |
| 5,397,728 | 3/1995 | Sasaki et al. | 437/44 |
| 5,399,515 | 3/1995 | Davis et al. | 437/29 |
| 5,770,514 | 6/1998 | Matsuda et al. | 438/589 |
| 5,895,939 | 4/1999 | Ueno | 257/279 |

*Primary Examiner*—John F. Niebling
*Assistant Examiner*—Michael S. Lebentritt
*Attorney, Agent, or Firm*—Morrison Law Firm

[57] ABSTRACT

A vertical SiC trench MOSFET power switching FET includes a gate electrode in the trench. The MOSFET adds a buried region of a first conductivity type, more heavily doped than a base layer of the first conductivity type, to the base layer except adjacent to the trench. The buried region is preferably disposed in the base layer, or between a drift layer of a second conductivity type and the base layer. The region of the first conductivity type is optionally disposed below the bottom of the trench to encourage expansion of the depletion layer of the MOSFET. A depletion-type vertical SiC MESFET of the invention includes a buried region of the first conductivity type in a base layer of a second conductivity type. A Schottky electrode on a portion of the base layer above the buried region ensures adequate expansion of a depletion layer.

14 Claims, 5 Drawing Sheets

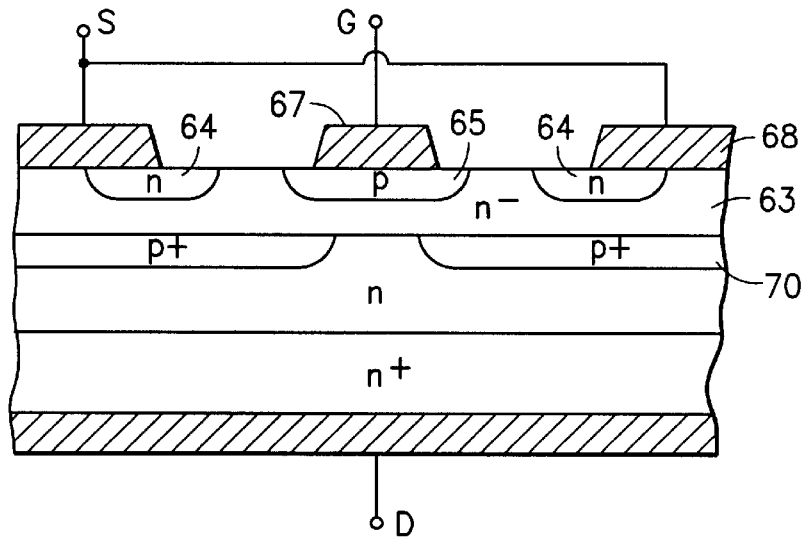
FIG.6
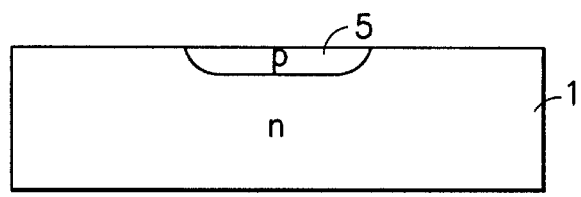
FIG.7A
FIG.7B
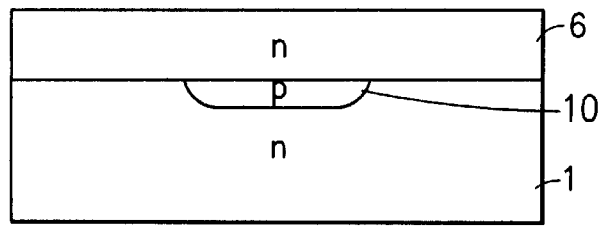
FIG.7C

SILICON CARBIDE FIELD EFFECT TRANSISTOR WITH INCREASED AVALANCHE WITHSTAND CAPABILITY

This application is a division of application Ser. No. 08/681,101, filed Jul. 22, 1996 now abandoned.

BACKGROUND OF THE INVENTION

This invention relates to a field effect transistor (hereinafter referred to as an "FET") made of silicon carbide (hereinafter referred to as "SiC") that operates under severe conditions, including elevated temperatures and elevated levels of ionizing radiation. In particular, this invention relates to SiC power semiconductor devices such as a vertical FET and a MESFET.

Silicon carbide has a wide band gap and is chemically stable. Semiconductor devices made from SiC operate successfully at higher temperatures and higher levels of ionizing radiation than silicon devices. The maximum operating temperature of conventional silicon devices is around 150° C. In contrast, some prototype SiC element devices such as p-n junction diodes and MOSFET's (FET's having a gate with a metal-oxide film-semiconductor structure) have been fabricated and operated successfully above 400° C. SiC devices operable at such high temperatures are quite useful for robots and computers in environments too severe for humans, such as near nuclear reactors or beyond the earth's atmosphere.

Conventional silicon devices require cooling to prevent overheating during operation. The cooling typically involves bulky radiator fins which complicate silicon device structure. In contrast, using SiC instead of Si in an FET permits simpler and smaller semiconductor packages. Use of SiC reduces weight and improves fuel consumption in those instances where semiconductor devices make up a large part of an apparatus, such as in an automobile. Thus, SiC devices are useful where environmental considerations are important.

Certain technical problems exist in manufacturing SiC power devices. The most difficult problem is obtaining deep impurity diffusion. The diffusion coefficients for impurities in SiC are much smaller than those for silicon. Therefore, high temperature heat treatment at 1500° C. or more is needed in order to achieve sufficiently deep diffusion in SiC. However, materials which tolerate such high temperatures are quite limited. It is also difficult to operate an electric furnace at that high a temperature with sufficient stability. Moreover, air reacts vigorously with the specimen at high temperatures, significantly affecting the device surface. Therefore, inventing a SiC device structure that eliminates the above difficulties is desirable.

Referring to FIG. 8, a vertical MOSFET according to the prior art is shown. The vertical MOSFET is an important device structure for applying SiC to power semiconductor devices. Since the vertical MOSFET is voltage driven, its driving circuits are simple. The vertical MOSFET is a monopolar device which switches at high speed. Although deep diffusion is difficult on SiC, epitaxial growth is relatively easy. Therefore, a trench MOSFET is popular for SiC devices.

A p-type base layer 83 is more easily formed by epitaxial growth than by thermal diffusion. An n-type drift layer 82, more lightly doped than an $n^+$ substrate 81, is epitaxially grown on the $n^+$ substrate 81. The p-type base layer 83 is epitaxially grown on the n-type drift layer 82. The no substrate 81, the drift layer 82, and the p-type base layer 83 constitute a SiC base plate. An n-type source region 84, which is heavily doped, is selectively formed in a surface portion of the SiC base plate. A trench 85 is formed from a part of the surface of the n-type source region 84 down into the n-type drift layer 82. A gate insulation film 86 covers the trench 85, with a gate electrode 87 fixed to the gate insulation film 86. A source electrode 88 contacts both the n-type source region 84 and an exposed surface portion of the p-type base layer 83. The $n^+$ substrate 81 has a drain electrode 89 disposed on its back surface.

During operation of the vertical MOSFET, a positive voltage that exceeds a threshold value is applied to the gate electrode 87. At the same time, a voltage is applied between the drain electrode 89 and the source electrode 88, creating an inversion layer in the surface portion of the p-type base layer 83 beside the gate electrode 87. An electron current flows from the source electrode 88 to the drain electrode 89 through this inversion layer. The gate insulation film 86, formed from silicon dioxide, is made by thermally oxidizing SiC.

A hole current flowing through the p-type base layer 83 during switching of the SiC vertical MOSFET causes a voltage drop across the resistance of the p-type base layer 83. This voltage drop forward biases a p-n junction between the n-type source region 84 and the p-type base layer 83, and drives a resulting parasitic npn transistor to cause the device to break down.

The usual power devices are required to withstand an avalanche current of a certain value. However, the capability of the conventional SiC vertical MOSFET to withstand avalanche, as defined by the insulation breakdown of the gate insulation film, is small since the breakdown starts from the trench of the gate portion.

Referring to FIG. 9, a MESFET (metal semiconductor field effect transistor) according to the prior art is shown. The MESFET is an important application of SiC to power semiconductor devices. (See, e.g., J. W. Parmer et al., "Diamond, Silicon Carbide, and Nitride Wide Band Gap Semiconductors", Proceedings of Materials Research Society, (1994).)

A p-type epitaxial layer 95 is formed on an $n^+$ substrate 91. An $n^-$ base layer 93 is grown on the p-type epitaxial layer 95. A heavily doped $n^+$ layer is formed on the $n^-$ base layer 93. The heavily doped $n^+$ layer is then selectively removed leaving a heavily doped $n^+$ source layer 94 and an $n^+$ drain region 90. A Schottky electrode 97 is disposed on an exposed surface portion of the $n^-$ base layer 93. A nickel film is deposited on the heavily doped $n^+$ source layer 94 and the $n^+$ drain region 90 by sputtering, forming a source electrode 98 and a drain electrode 99.

During operation of the MESFET, a current flows when a voltage is applied between the drain electrode 99 and the source electrode 98. A depletion layer is expanded into the $n^-$ base layer 93 beneath the Schottky electrode 97 by applying a negative voltage exceeding a certain threshold value to the Schottky electrode 97. The current is interrupted when the depletion layer reaches the p-type epitaxial layer 95.

Since the current carrying region of the conventional MESFET has to be narrow enough so that a depletion layer sufficiently expands therein in the OFF state of the MESFET, the ON-resistance of the current carrying region is too high to permit the high current required from power devices.

OBJECTS AND SUMMARY OF THE INVENTION

Accordingly, it is an object of the present invention to provide a SiC FET for controlling high currents.

Another object of the present invention is to avoid insulation breakdown of the gate insulation film in a SiC vertical FET.

An further object of the present invention is to increase the avalanche withstand capability of a SiC vertical FET.

A still further object of the present invention is to reduce the ON-resistance of a SiC MESFET.

Briefly stated, a vertical SiC trench MOSFET power switching FET includes a gate electrode in the trench. The MOSFET adds a buried region of a first conductivity type, more heavily doped than a base layer of the first conductivity type, to the base layer except adjacent to the trench. The buried region is preferably disposed in the base layer, or between a drift layer of a second conductivity type and the base layer. The region of the first conductivity type is optionally disposed below the bottom of the trench to encourage expansion of the depletion layer of the MOSFET. A depletion-type vertical SiC MESFET of the invention includes a buried region of the first conductivity type in a base layer of a second conductivity type. A Schottky electrode on a portion of the base layer above the buried region ensures adequate expansion of a depletion layer.

According to an embodiment of the invention, a vertical field effect transistor includes a substrate of a first conductivity type, the substrate being SiC, a drift layer of the first conductivity type epitaxially grown on the substrate, the drift layer being of SiC and doped more lightly than the substrate, a SiC base layer of a second conductivity type epitaxially grown on the drift layer, a source region of the first conductivity type, formed in a part of a surface portion of the base layer, a trench extending from a surface of the source region into the drift layer, a gate insulation film covering the trench, a gate electrode on the gate insulation film, a region of the second conductivity type, and the region of the second conductivity type being doped more heavily than the base layer and surrounding an area adjacent to the trench.

According to an embodiment of the invention, a vertical field effect transistor includes a substrate of a first conductivity type, the substrate being of SiC, a SiC base layer of the first conductivity type epitaxially grown on the substrate, at least one buried region of a second conductivity type selectively formed in the base layer leaving a central region wherein the at least one buried region is not formed, at least one source region of the first conductivity type selectively formed in a surface portion of the base layer above both sides of the central region wherein the at least one buried region is not formed, a source electrode contacting in common the source region and the base layer, a drain electrode disposed on a back surface of the substrate, and a control electrode disposed on a surface of the base layer above the central region wherein the at least one buried region is not formed.

According to an embodiment of the invention, a vertical field effect transistor includes a substrate of a first conductivity type, the substrate being of SiC, a drift layer of the first conductivity type epitaxially grown on the substrate, the drift layer being of SiC and doped more lightly than the substrate, at least one buried regions of a second conductivity type selectively formed in the drift layer leaving a central region wherein the at least one buried region is not formed, at least one source region of the first conductivity type selectively formed in a surface portion of the drift layer above both sides of the central region wherein the at least one buried region is not formed, a source electrode contacting in common the source region and the drift layer, a drain electrode disposed on a back surface of the substrate, and a control electrode disposed on the surface of drift layer above the central region wherein the at least one buried region is not formed.

According to an embodiment of the present invention, a method of constructing a vertical field effect transistor includes preparing a substrate of a first conductivity type, the substrate being made of SiC, epitaxially growing a drift layer of the first conductivity type on the substrate, the drift layer being made of SiC and doped more lightly than the substrate, epitaxially growing a SiC base layer of a second conductivity type on the drift layer, forming a source region of the first conductivity type in a part of a surface portion of the base layer, forming a trench extending from a surface of the source region into the drift layer, covering the trench with a gate insulation film, placing a gate electrode on the gate insulation film, and inserting a region of the second conductivity type into a portion of the field effect transistor, the region of the second conductivity type being doped more heavily than the base layer and surrounding an area adjacent to the trench.

According to an embodiment of the present invention, a method for constructing a vertical field effect transistor includes preparing a substrate of a first conductivity type, the substrate being made of SiC, epitaxially growing a drift layer of the first conductivity type on the substrate, the drift layer being made of SiC and doped more lightly than the substrate, forming at least one buried region of a second conductivity type selectively in the drift layer leaving a central region wherein the at least one buried region is not formed, forming at least one source region of the first conductivity type selectively in a surface portion of drift layer above both sides of the central region wherein the at least one buried region is not formed, attaching a source electrode contacting in common the source region and the drift layer, disposing a drain electrode on a back surface of the substrate, and disposing a control electrode on a surface of the drift layer above the central region wherein the at least one buried region is not formed.

According to an embodiment of the present invention, a method for constructing a vertical field effect transistor includes preparing a substrate of a first conductivity type, the substrate being made of SiC, epitaxially growing a drift layer of the first conductivity type on the substrate, the drift layer being made of SiC and doped more lightly than the substrate, forming at least one buried region of a second conductivity type selectively in the drift layer leaving a central region wherein the at least one buried region is not formed, forming at least one source region of the first conductivity type selectively in a surface portion of the drift layer above both sides of the central region wherein the at least one buried region is not formed, attaching a source electrode contacting in common the source region and the drift layer, disposing a drain electrode on a back surface of the substrate, and disposing a control electrode on a surface of the drift layer above the central region wherein the at least one buried region is not formed.

According to an embodiment of the present invention, a vertical SiC field effect transistor includes a base layer of a first conductivity type, a trench extending through the base layer, a gate electrode in the trench, a buried region of the first conductivity type disposed in the base layer except adjacent to the trench, and the buried region being more heavily doped than the base layer.

The region of the second conductivity type is preferably disposed in the base layer, or between the drift layer and the base layer. The region of the second conductivity type is optionally disposed below the bottom of the trench.

According to an embodiment of the invention, a SiC vertical field effect transistor includes a substrate of a first conductivity type, the substrate being made of SiC, a base layer of the first conductivity type epitaxially grown on the substrate, the base layer being made of SiC and doped more lightly than the substrate, buried regions of a second conductivity type selectively formed in the base layer leaving a central region wherein the buried regions are absent, source regions of the first conductivity type selectively formed in the surface portion of the base layer above both sides of the region wherein the buried regions are not formed, a source electrode contacting in common with the source region and the base layer, a drain electrode disposed on the back surface of the substrate, and a control electrode disposed on the surface of the base layer above the region wherein the buried regions are not formed. In the structure described above, the base layer of the first conductivity type may be a drift layer of the first conductivity type, or the base layer of the first conductivity type may be formed on a drift layer of the first conductivity type.

The control electrode preferably forms a Schottky junction with the base layer (drift layer). The control electrode preferably includes a metal film disposed on an insulation film formed on the base layer (drift layer).

The field effect transistor preferably further includes a region of the second conductivity type formed in a surface portion of the base layer (drift layer), the region of the second conductivity type making an ohmic contact with the control electrode, the control electrode comprising a metal film.

The control electrode is preferably made of a material selected from a group consisting of Ti, Au, Pt, and Al—Ti alloy.

The SiC vertical FET of the invention exhibits the following functions.

According to an aspect of the invention, the resistance of the base layer of the second conductivity type is reduced by disposing a region of the second conductivity type in the base layer or on the boundary between the base layer and the drift layer of the first conductivity type. This disposed region is doped more heavily than the base layer. It avoids the vicinity of the trench.

Furthermore, by disposing the region of the second conductivity type below the bottom of the trench, the electric field is prevented from localizing to the gate oxide film.

A MESFET is obtained by forming buried regions of the second conductivity type selectively in the base layer of the first conductivity type (or the drift layer of the first conductivity type) leaving a central region wherein the buried regions are not formed, source regions of the first conductivity type selectively in the surface portion of the base layer (drift layer) above both sides of the region wherein the buried regions are not formed, a source electrode contacting in common with the source region and the base layer (drift layer), a drain electrode on the back surface of the substrate, and a control electrode, forming a Schottky junction with the base layer (drift layer), on the surface of the base layer (drift layer) above the region wherein the buried regions are not formed.

A MOSFET is obtained by forming the control electrode as a metal film disposed above the base layer (drift layer) via an insulation film.

A junction type FET is obtained by providing the FET with a region of the second conductivity type in the surface portion of the base layer (drift layer) and by forming the control electrode as a metal film making an ohmic contact with the region of the second conductivity type.

A Schottky electrode supporting a sufficient reverse bias voltage may be formed at relatively low temperatures by making the Schottky electrode of Ti, Pt, or Al—Ti alloy.

The present invention is intended to improve the properties of SiC vertical FET's by forming buried regions of the second conductivity type in various locations in the base layer of the second conductivity type or in the base layer of the first conductivity type.

The resistance of the base layer of the second conductivity type is reduced, the breakdown of the device caused by the operation of a parasitic npn transistor is prevented, and the controllable current of the device is increased, for example, by burying a region of the second conductivity type, more heavily doped than the base layer of the second conductivity type, in the base layer or by locating the region of the second conductivity type in adjacent to the base layer.

The electric field across the gate insulation film is weakened and the avalanche withstand capability is improved by disposing the region of the second conductivity type below the bottom of the trench.

Moreover, the resistance of the base layer of the first conductivity type and the ON-resistance of the depletion type FET are reduced by disposing a buried region in the base layer of the first conductivity type.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 6 is a cross section of a main part of a SiC vertical JFET according to an embodiment of the present invention.

FIG. 7A is a cross section for explaining a first manufacturing step of the $p^+$ buried region of the embodiment of FIG. 1.

FIG. 7B is a cross section for explaining a second manufacturing step of the $p^+$ buried region of the embodiment of FIG. 1.

FIG. 7C is a cross section for explaining a third manufacturing step of the $p^+$ buried region of the embodiment of FIG. 1.

DETAILED DESCRIPTION OF THE PREFERRED EMBODIMENT

Figure 1:
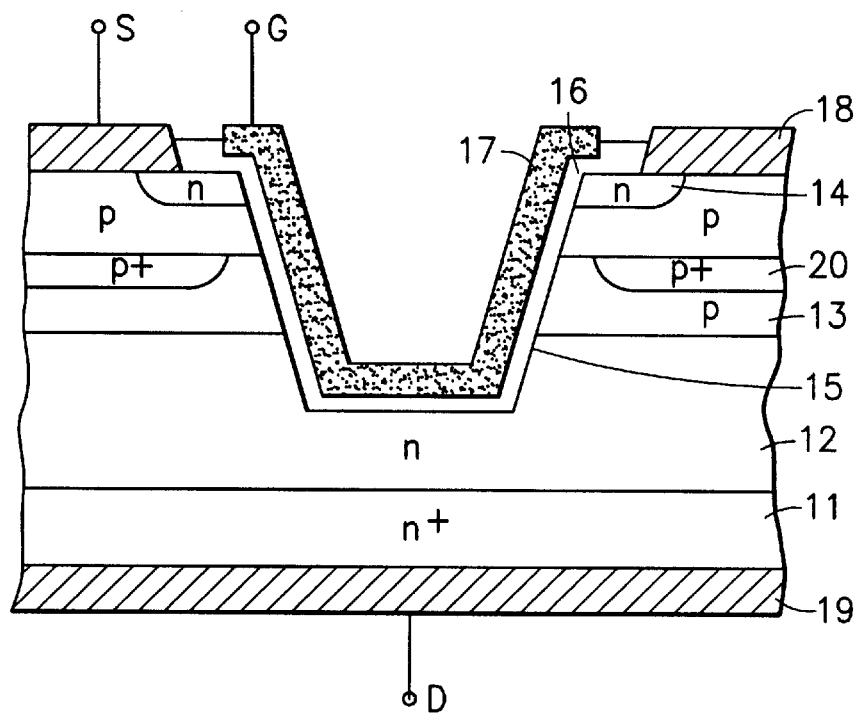
FIG. 1 is a cross section of a main part of a SiC vertical MOSFET according to an embodiment of the present invention.

Referring to FIG. 1, an n-type drift layer 12, from 2 to 60 µm thick, is preferably epitaxially grown on an n+ substrate 11. An impurity concentration of the n-type drift layer 12 is preferably from $1 \times 10^{15}$ to $1 \times 10^{16}$ cm$^{-3}$. A p-type base layer 13, from 1 to 10 µm thick, is preferably epitaxially grown on the n-type drift layer 12. The impurity concentration of p-type base layer 13 is preferably from $1 \times 10^{16}$ to $1 \times 10^{17}$ cm$^{-3}$. The n+ substrate 11, the n-type drift layer 12, and the p-type base layer 13 constitute a SiC base plate.

A heavily doped n-type source region 14 is selectively formed by ion implantation on the surface portion of the p-type base layer 13. A trench 15 is formed from a portion of the surface of the heavily doped n-type source region 14 down into the n-type drift layer 12. The trench 15 is from 1 to 10 µm wide. A gate insulation film 16, preferably made from silicon oxide, covers the trench 15. A gate electrode 17, preferably made from polycrystalline silicon, is disposed on the gate insulation film 16. A source electrode 18, preferably made from Ni film, contacts both the heavily doped n-type source region 14 and an exposed surface portion of the p-type base layer 13. A drain electrode 19, preferably made from Ni film, is disposed on the back surface of the n+ substrate 11. These structural features are the same as those of the conventional MOSFET.

In the present embodiment, a p+ buried region 20, with impurity concentration preferably from $1 \times 10^{16}$ to $1 \times 10^{19}$ cm$^{-3}$ and thickness of from 0.1 to 1 µm, is disposed in the p-type base layer 13. Metals such as Al, Ti, and Mo are optionally used in place of Ni for the source electrode 18 and the drain electrode 19.

Referring to FIGS. 7A–7C, the method for forming the p+ buried region 20 is explained. Some impurities 4 are introduced to a specific region of a SiC substrate 1, midway during the epitaxial growth of the layers on the SiC substrate 1. The impurities 4 are introduced by implanting some impurity ions 3 through a mask 2 of an oxide film or photoresist. Then, a diffusion region 5 is formed by heat treatment to activate electrically the impurities 4 previously implanted. Finally, a buried region 10 is formed between the SiC substrate 1 and an epitaxial layer 6 deposited on diffusion region 5 and SiC substrate 1. This method is sometimes referred to as "burying epitaxial growth".

Referring again to FIG. 1, applying a positive voltage above a certain threshold value to the gate electrode 17 while applying a voltage between the drain electrode 19 and the source electrode 18 creates an inversion layer in the surface portion of the p-type base layer 13 beside the gate electrode 17. An electron current flows from the source electrode 18 to the drain electrode 19 through that inversion layer.

A hole current flowing through the p-type base layer 13 during switching causes a voltage drop across the resistance of the p-type base layer 13. This voltage drop forward-biases the p-n junction between the heavily doped n-type source region 14 and the p-type base layer 13, sometimes causing breakdown in a parasitic npn transistor. This mechanism limits the controllable current.

The resistance of the p-type base layer 13 is substantially reduced without altering the threshold value of the MOSFET at which it turns on by adding the p+ buried region 20. The p+ buried region 20 does not occupy that portion of the p-type base layer 13 adjacent to the trench 15. Lowering the resistance of the p-type base layer 13 reduces the voltage drop from the hole current flowing through the p-type base layer 13, thereby preventing MOSFET breakdown. The controllable current of the MOSFET is also increased. It has been found empirically that halving the resistance of the p-type base layer 13 by adding the p+ buried region 20 increases the controllable current by 50%.

The p+ buried region 20 is preferably in contact with the p-type base layer 13. The p+ buried region 20 is optionally located deeper than the trench 15. In order to avoid changing the MOSFET gate threshold value, it is important that the p+ buried region 20 not overlap the channel region.

Figure 2:
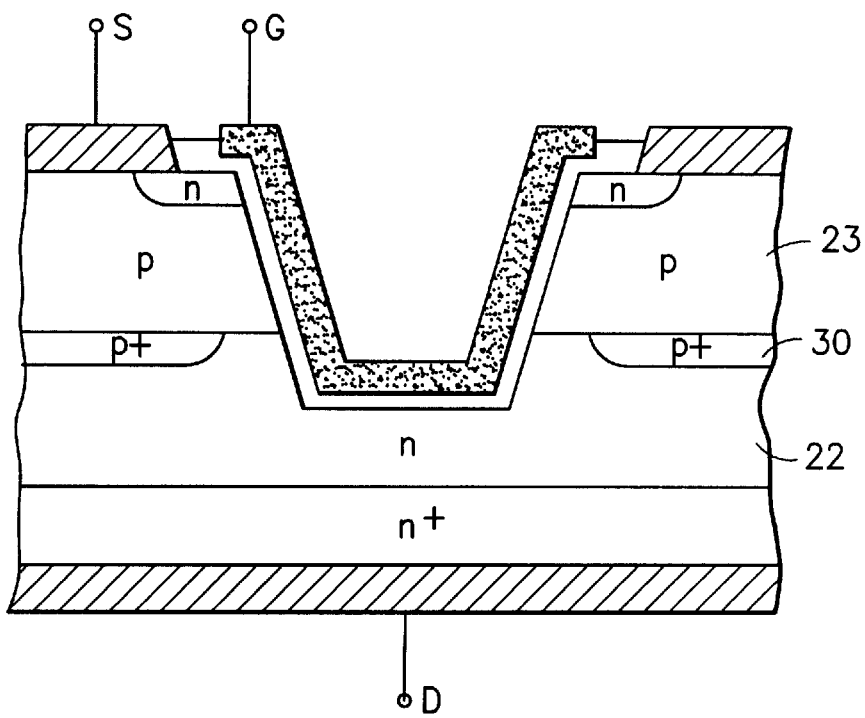
FIG. 2 is a cross section of a main part of a SiC vertical MOSFET according to an embodiment of the present invention.

Referring to FIG. 2, a cross section of a main part of a second embodiment of a SiC vertical MOSFET according to the present invention is shown. The second embodiment is different from the first embodiment of FIG. 1 in that a p+ buried region 30 is disposed on the boundary between an n-type drift layer 22 and a p-type base layer 23 instead of in the p-type base layer 23. The impurity concentration and thickness of the p+ buried region 30 are the same as in the first embodiment. Lowering the substantial resistance of the p-type base layer 23 prevents breakdown and increases the controllable current as in the first embodiment.

Figure 3A:
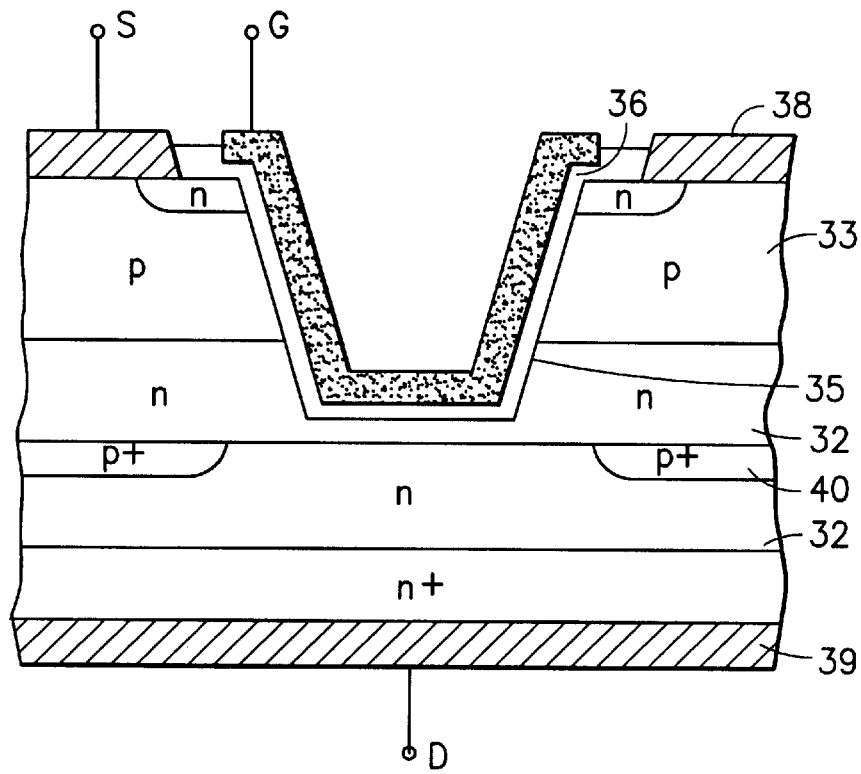
FIG. 3A is a cross section of a main part of a SiC vertical MOSFET according to an embodiment of the present invention.

Referring to FIG. 3A, a third embodiment protects the gate insulation film against a high electric field. Since SiC has a high electric field strength, a higher electric field is applied to the gate insulation of the SiC devices than with silicon devices. The third embodiment provides a structure which relaxes the electric field across the gate insulation film.

A p+ buried region 40 is disposed 1 to 5 µm below the top of an n-type drift layer 32. A trench 35 is preferably formed by reactive ion etching with its bottom positioned between the p+ buried regions 40, 40. When a reverse voltage is applied between a source electrode 38 and a drain electrode 39, a depletion layer expands from a p-n junction between a p-type base layer 33 and the n-type drift layer 32. By applying a higher voltage than the voltage which expands the depletion layer to p+ buried regions 40, the depletion layer further is expanded below the p+ buried region 40. Thus, the p+ buried region 40 functions to expand the depletion layer and to relax the electric field. The structure of FIG. 3A applies the so-called guard ring structure, adopted to expand a depletion layer laterally from a p-n junction to a vertical device.

Though a maximum electric field is applied to the gate insulation film, the electric field across the gate insulation film of the MOSFET is relaxed, since a depletion layer expands below the p+ buried region 40. Since the p+ buried region 40 is positioned deeper than the trench 35 in the gate portion of the device, avalanche breakdown is not present in the corner portion of trench 35 of the gate portion. A gate insulation film 36 is therefore not broken down, even when the voltage applied between the drain electrode 39 and the source electrode 38 is further raised. Since the gate insulation film 36 is not broken down during voltage application, the avalanche withstand capability is improved. Deeply forming the p+ buried region 30 below trench 35 creates a MOSFET that exhibits a high controllable current and high avalanche withstand capability.

Figure 3B:
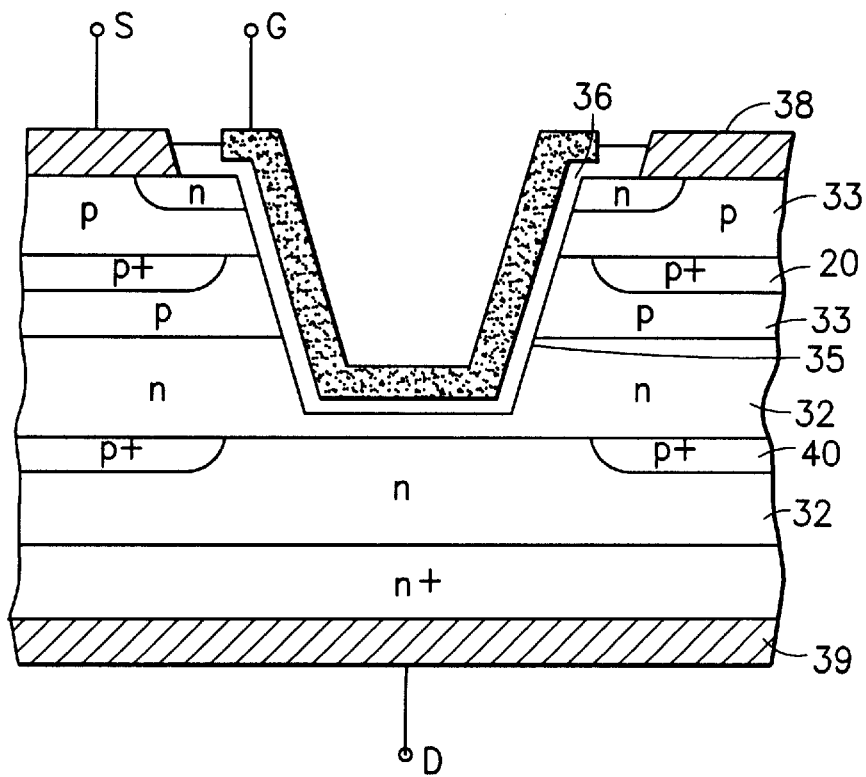
FIG. 3B is a cross section of a main part of a SiC vertical MOSFET according to an embodiment of the present invention.

Referring to FIG. 3B, the first and third embodiments are optionally combined to obtain a MOSFET which has the p+ buried regions 20 and 40. In this case, the beneficial effects of the p+ buried regions 20 and 40 are combined, resulting in a MOSFET with high controllable current and high avalanche withstand capability.

Figure 4:
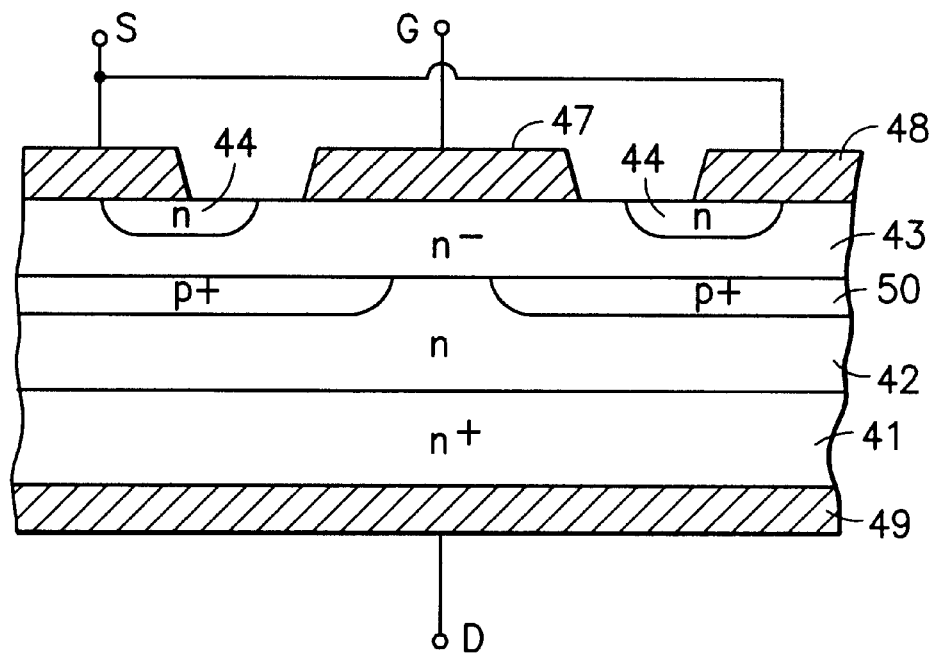
FIG. 4 is a cross section of a main part of a SiC vertical MESFET according to an embodiment of the present invention.

Referring to FIG. 4, a cross section of a main part of a fourth embodiment of a SiC vertical MESFET according to the present invention is shown. A SiC base plate is obtained by epitaxially growing an n⁻ base layer 43 on an n⁺ substrate 41. The n⁻ base layer 43 is more lightly doped than the n⁺ substrate 41. A heavily doped p⁺ buried region 50 is formed in the n⁻ base layer 43. An n-type drift layer 42 is optionally disposed below the n⁻ base layer 43 as shown in FIG. 4, or the n-type drift layer 42 is optionally doped with the same impurity concentration as the n⁻ base layer 43. The p⁺ buried region 50 is selectively formed without the central part. For the n-type drift layer 42, the impurity concentration is preferably $1\times10^{15}$ to $1\times10^{16}$ cm$^{-3}$; the thickness is 2 to 50 μm. For the n⁻ base layer 43 the impurity concentration is preferably $1\times10^{15}$ to $1\times10^{16}$ cm$^{-3}$; the thickness is 0.1 to 2 μm. For the p⁺ buried region 50 the impurity concentration is preferably $1\times10^{16}$ to $1\times10^{19}$ cm$^{-3}$; the thickness is 0.1 to 1 μm. The width L of the central gap in the p⁺ buried region 50 is preferably 1 to 10 μm. An n-type source region 44, 44 is selectively formed in a surface portion of the n⁻ base layer 43 located above the central gap in the p⁺ buried region 50. A source electrode 48, preferably made from Ni film, is disposed in common contact with the n-type source region 44 and the n⁻ base layer 43. The source electrode 48 is connected to a terminal S. A Schottky electrode 47, preferably made from Ti film, is disposed on a surface portion of the n⁻ base layer 43 between the n-type source regions 44, 44. The Schottky electrode 47 is connected to a terminal G. The p⁺ buried region 50 is optionally formed by the method explained earlier with reference to FIG. 7 for the first embodiment. The film of the Schottky electrode 47 is optionally made of metals such as Al, Au, and Pt as well as Ti.

The vertical device of the present embodiment is different from a conventional lateral SiC MESFET in that the structure increases the current capacity. The device is not an enhancement type with a channel formed by inverting the surface portion of the p-type base layer, but a depletion type in which a current flows through an n-type crystal region. Therefore, the ON-resistance of the device is reduced. The structure shown is well suited for reducing the ON-resistance and for increasing the capacity of a vertical device in which the switching current flows vertically. Thus, the problems associated with conventional SiC lateral MESFET's are substantially reduced.

Figure 5:
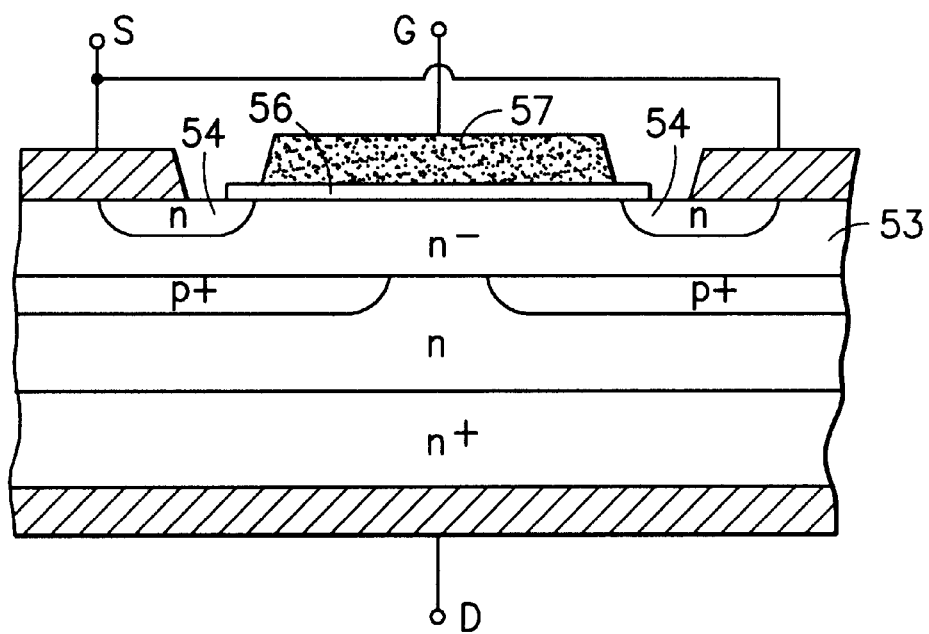
FIG. 5 is a cross section of a main part of a SiC vertical MOSFET according to an embodiment of the present invention.
Figure 8:
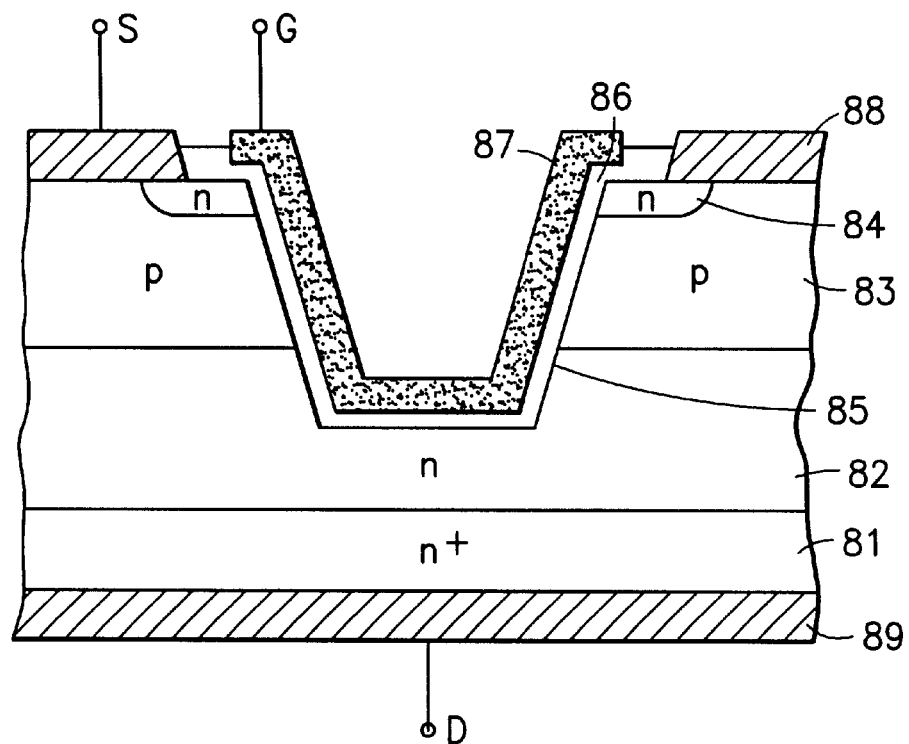
FIG. 8 is a cross section of a main part of a conventional SiC vertical trench MOSFET.
Figure 9:
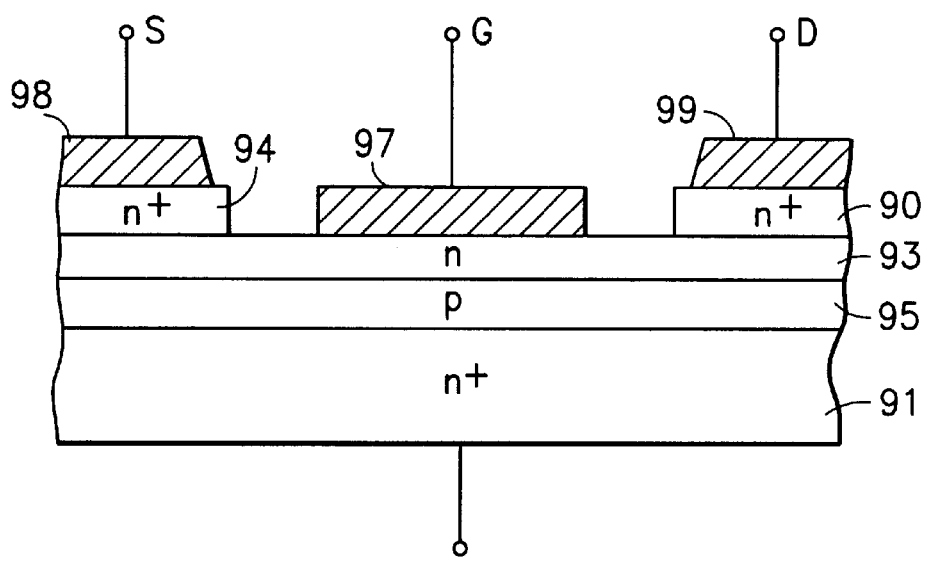
FIG. 9 is a cross section of a main part of a conventional SiC lateral MESFET.

Referring to FIG. 5, a cross section of a main part of a fifth embodiment of a SiC vertical MOSFET according to the present invention is shown. The MOSFET is operated in the same way as the fourth embodiment of FIG. 4 and is deemed a modification of the fourth embodiment. In FIG. 5, a MOS gate structure is adopted for applying a gate voltage. That is, a gate electrode 57 made from polycrystalline silicon is disposed on a gate silicon oxide film 56 above an n⁻ base layer 53. The gate electrode 57 is connected to a terminal G. The MOS gate structure is easily formed since the gate silicon oxide film 56 forms easily on the surface of SiC by thermal oxidation.

Referring to FIG. 6, a cross section of a main part of a sixth embodiment of a SiC vertical FET according to the present invention is shown. The junction-type FET (JFET) adopts a p-n junction, instead of a Schottky junction, for applying a voltage to the gate. A p-type region 65 is formed by ion implantation and subsequent heat treatment on a surface portion of a n base layer 63 between an n-type source region 64, 64. A gate electrode 67 is disposed on the p-type region 65. The JFET is turned off by applying to the gate electrode 67 a voltage negative with respect to a source electrode 68 to reverse bias the p-n junction between the p-type region 65 and the n⁻ base layer 63. The reverse bias expands a depletion layer to fill a portion between a p⁺ buried region 70, 70, where the current from the source is interrupted. While the electrical resistance of the channel in the inversion layer of the conventional MOSFET is large, a switching device with low ON-resistance is obtained here using a JFET with a single crystal region as the current path. Applying a voltage, positive with respect to the source electrode 68, to the gate electrode 67 injects holes to further reduce the ON resistance.

As explained above, the SiC vertical trench MOSFET of the invention, which has a heavily doped buried region in the base layer of the second conductivity type, facilitates lowering the substantial resistance thereof and increases the controllable current thereof. A SiC trench MOSFET, in which insulation breakdown is eliminated in the gate insulation film thereof during voltage application, and which exhibits high avalanche withstand capability, is realized by disposing a buried region of the second conductivity type below the bottom of the trench. One device may have both schemes described above.

A SiC vertical FET, which switches with low ON-resistance, is realized by disposing a buried region of the second conductivity type and by expanding a depletion layer either from a Schottky electrode on the device surface, from an insulated gate electrode disposed via an insulation film, or from a p-n junction. Thus, the present invention increases the range of uses of SiC vertical FET's.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A method of constructing a vertical field effect transistor, comprising:
   preparing a substrate of a first conductivity type, said substrate being made of SiC;
   epitaxially growing a drift layer of said first conductivity type on said substrate, said drift layer being made of SiC and doped more lightly than said substrate;
   epitaxially growing a SiC base layer of a second conductivity type on said drift layer;
   forming a source region of said first conductivity type in a part of a surface portion of said base layer;
   forming a trench extending from a surface of said source region into said drift layer;
   covering said trench with a gate insulation film;
   placing a gate electrode on said gate insulation film; and
   inserting a region of said second conductivity type into a portion of said field effect transistor, said region of said second conductivity type being doped more heavily than said base layer and surrounding an area adjacent to said trench.

2. The method according to claim 1, wherein said region of said second conductivity type is disposed in said base layer.

3. The method according to claim 1, wherein said region of said second conductivity type is disposed between said drift layer and said base layer.

4. The method according to claim 1, wherein said region of said second conductivity type is disposed below a bottom of said trench.

5. A method for constructing a vertical field effect transistor, comprising:

preparing a substrate of a first conductivity type, said substrate being made of SiC;

epitaxially growing a drift layer of said first conductivity type on said substrate, said drift layer being made of SiC and doped more lightly than said substrate;

forming at least one buried region of a second conductivity type selectively in said drift layer leaving a central region wherein said at least one buried region is not formed;

forming at least one source region of said first conductivity type selectively in a surface portion of drift layer above both sides of said central region wherein said at least one buried region is not formed;

attaching a source electrode contacting in common said source region and said drift layer;

disposing a drain electrode on a back surface of said substrate; and disposing a control electrode on a surface of said drift layer above said central region wherein said at least one buried region is not formed.

6. The method according to claim 5, wherein said control electrode forms a Schottky junction with said drift layers.

7. The method according to claim 5, wherein said control electrode comprises a metal film disposed on an insulation film formed on said drift layer.

8. The method according to claim 5, further comprising forming a region of said second conductivity type in a surface portion of said drift layer, said region of said second conductivity type making ohmic contact with said control electrode, and said control electrode comprising a metal film.

9. The method according to claim 6, wherein said control electrode is made of a material selected from the group consisting of Ti, Au, Pt, and Al—Ti alloy.

10. A method for constructing a vertical field effect transistor, comprising:

preparing a substrate of a first conductivity type, said substrate being made of SiC;

epitaxially growing a drift layer of said first conductivity type on said substrate, said drift layer being made of SiC and doped more lightly than said substrate;

forming at least one buried region of a second conductivity type selectively in said drift layer leaving a central region wherein said at least one buried region is not formed;

forming at least one source region of said first conductivity type selectively in a surface portion of said drift layer above both sides of said central region wherein said at least one buried region is not formed;

attaching a source electrode contacting in common said source region and said drift layer;

disposing a drain electrode on a back surface of said substrate; and disposing a control electrode on a surface of said drift layer above said central region wherein said at least one buried region is not formed.

11. The method according to claim 10, wherein said control electrode forms a Schottky junction with said drift layer.

12. The method according to claim 10, wherein said control electrode comprises a metal film disposed on an insulation film formed on said drift layer.

13. The method according to claim 10, further comprising forming a region of said second conductivity type in a surface portion of said drift layer, said region of said second conductivity type making ohmic contact with said control electrode, and said control electrode comprising a metal film.

14. The method according to claim 10, wherein said control electrode is made of a material selected from the group consisting of Ti, Au, Pt, and Al—Ti alloy.

\* \* \* \* \*